US011784358B2

(12) United States Patent
Nemanick et al.

(10) Patent No.: US 11,784,358 B2
(45) Date of Patent: Oct. 10, 2023

(54) SELF REGULATING MODULAR BATTERY

(71) Applicant: The Aerospace Corporation, El Segundo, CA (US)

(72) Inventors: Eric Joseph Nemanick, Santa Monica, CA (US); Ann L. Chervenak, Los Angeles, CA (US); Joseph Z. Fuerst, Beavercreek, OH (US); Andrew Brethorst, Hawthorne, CA (US); Michael R. Hale, West Hollywood, CA (US); Kevin Macdougall, Torrance, CA (US); Justin Stocker, Sherman Oaks, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 191 days.

(21) Appl. No.: 17/369,895

(22) Filed: Jul. 7, 2021

(65) Prior Publication Data

US 2023/0012390 A1  Jan. 12, 2023

(51) Int. Cl.
*H01M 10/48* (2006.01)
*H01M 10/42* (2006.01)

(52) U.S. Cl.
CPC ....... *H01M 10/48* (2013.01); *H01M 10/4257* (2013.01); *H01M 2010/4271* (2013.01); *H01M 2010/4278* (2013.01)

(58) Field of Classification Search
CPC ............. H01M 10/4257; H01M 10/48; H01M 2010/4271; H01M 2010/4278
See application file for complete search history.

(56) References Cited

U.S. PATENT DOCUMENTS

| 8,719,195 B2 | 5/2014 | Frisch et al. |
| 8,903,560 B2 | 12/2014 | Miller |
| 9,368,991 B2 | 6/2016 | Qahouq |

(Continued)

FOREIGN PATENT DOCUMENTS

| WO | 2012009724 A1 | 1/2012 | |
| WO | 2017062919 A1 | 4/2017 | |
| WO | WO-2020190665 A1 * | 9/2020 | ........... H01M 10/425 |

OTHER PUBLICATIONS

Donald Azuatalam, et al, "Energy Management of Small-Scale PV-Battery Systems", https://arxiv.org/pdf/1905.09498.pdf.

(Continued)

*Primary Examiner* — Victoria H Lynch
(74) *Attorney, Agent, or Firm* — LeonardPatel PC

(57) ABSTRACT

A self-regulating battery may generate a basis state for one or more modules using one or more system inputs. The system inputs comprise current, voltage, and battery degradation. The battery generates a family of weighted forecasts for future bus demands using usage and performance based weights. The battery generates one or more plans to support demand from the battery using the weighted forecasts. The battery scores the one or more plans based on efficiency of power extraction from the battery, and combines the scored one or more plans with an updated SoH value based on induced degradation from a usage plan. The battery generates the combined scored for each of the one or more plans, and transmits one of the combined scored to the battery management unit for execution.

21 Claims, 7 Drawing Sheets

(56) References Cited

U.S. PATENT DOCUMENTS

| | | |
|---|---|---|
| 9,525,290 B2 | 12/2016 | Snyder |
| 10,228,425 B2 | 3/2019 | Park et al. |
| 10,250,039 B2 | 4/2019 | Wenzel et al. |
| 10,422,837 B2 | 9/2019 | Park et al. |
| 2011/0208365 A1 | 8/2011 | Miller |
| 2013/0091083 A1 | 4/2013 | Frisch et al. |
| 2013/0320772 A1* | 12/2013 | Qiao .................... H01M 10/04 307/85 |
| 2014/0125284 A1 | 5/2014 | Qahouq |
| 2015/0115736 A1 | 4/2015 | Snyder |
| 2015/0130421 A1 | 5/2015 | Bevilacqua, III |
| 2015/0369874 A1 | 12/2015 | Park et al. |
| 2016/0363632 A1 | 12/2016 | Park et al. |
| 2017/0104332 A1 | 4/2017 | Wenzel et al. |
| 2017/0115355 A1 | 4/2017 | Willard et al. |

OTHER PUBLICATIONS

Hannes Knobloch, "Predicting Battery Lifetime with CNNs", Towards Data Science, https://towardsdatascience.com/predicting-battery-lifetime-with-cnns-c5e1faeecc8f.

Maitane Berecibar, "Machine-Learning Techniques Used to Accurately Predict Battery Life", Nature 568, 325-326 (2019) https://www.nature.com/articles/d41586-019-01138-1.

Man-Fai NG, et al., "Predicting the State of Charge and Health of Batteries Using Data-Driven Machine Learning", Nature Machine Intelligence, vol. 2, Mar. 2020, pp. 161-170, https://www.nature.com/articles/s42256-020-0156-7.

\* cited by examiner

SELF REGULATING MODULAR BATTERY

FIELD

The present invention relates to batteries, and more particularly, to a self-regulating modular battery designed to control battery load and optimize future power use.

BACKGROUND

Current state of the art power systems can forecast future battery usage, and can alter their discharge, temperature, charging, and other performance parameters in response. However, these power systems can only respond to forecasted system loads as a monolithic unit. For this reason, the current state of the art battery systems cannot efficiently leverage forecasted loads or conditions by adjusting individual energy storage component utilization to maximize long term power system health or performance.

Additionally, current state of the art power systems utilize monolithic power systems with all battery modules needing to be rigorously identical, and do not have the ability to have individual sub-units of the battery support system electrical load independently of the other battery sub-units. There is no capability of a battery management system to adjust individual cell or module usage for optimal performance, as the minimum optimization unit is the entire power system. Because of this, the benefits of optimization from forecasted conditions are substantially reduced, including a reduced ability to respond to battery module failures or to variations in module temperatures, performance, or conditions.

Furthermore, the current state of the art hardware does not allow for a power system architecture with different module types with a unified, regulated, conditioned power output, nor does it forecast power demand with the intention to change the utilization of each battery module or sub module to optimize battery performance. Without the ability to direct individual module use, or to incorporate different types of modules in a power system, current technology cannot efficiently optimize power system performance in this fashion.

With forecasted need and detailed control of individual energy storage sub-modules, an improved power system configured to regulate the battery is needed.

SUMMARY

Certain embodiments of the present invention may provide solutions to the problems and needs in the art that have not yet been fully identified, appreciated, or solved by current power system technologies. For example, some embodiments of the present invention pertain to a self-regulating modular battery (SRMB).

In an embodiment, a system for self-regulating a battery includes a machine learning module receiving battery parameter history and generating a battery degradation forecast and one or more probability weighted demand forecasts. The system also includes a battery state of health (SoH) module computing an updated battery model using one or more internal battery parameters and the battery degradation forecast, and a power system module generating, from the updated battery model, one or more module support plans where one of the one or more module support plans is used as a power out plan for a battery management unit. The one or more support plans are evaluated against one or more battery requirements to generate a usage score to be assigned to each of the one or more support plans.

In another embodiment, a method includes generating a basis state for one or more modules using one or more system inputs. The system inputs comprise current, voltage, and battery degradation. The method includes generating a family of weighted forecasts for future bus demands using usage and performance based weights. The method includes generating one or more plans to support demand from the battery using the weighted forecasts. The method also includes scoring the one or more plans based on efficiency of power extraction from the battery, and combining the scored one or more plans with an updated SoH value based on induced degradation from a usage plan. The method includes generating the combined scored for each of the one or more plans, and transmitting one of the combined scores to the battery management unit for execution.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
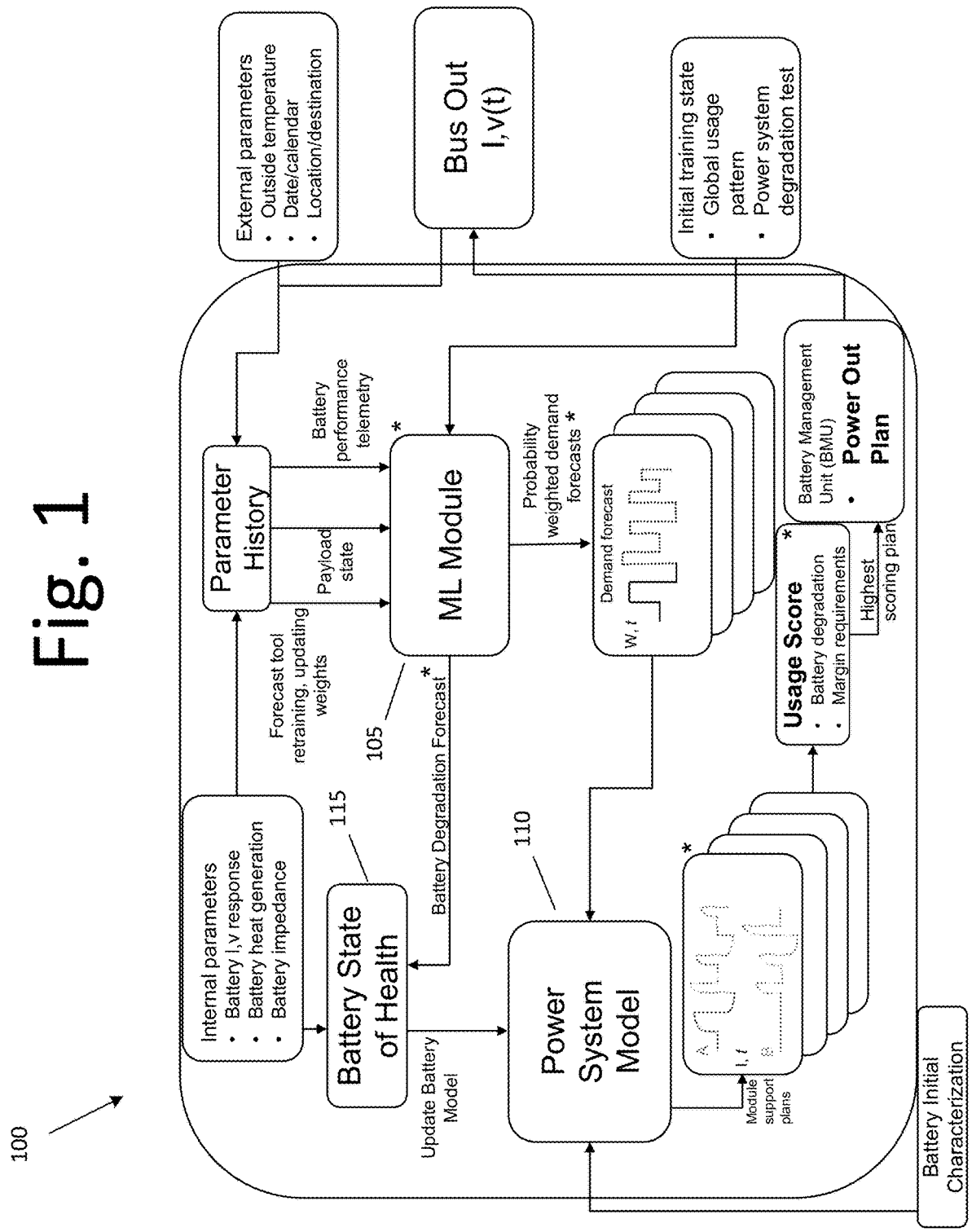
FIG. 1 is a diagram illustrating a self-regulating battery, according to an embodiment of the present invention.

With forecasted need and detailed control of individual energy storage sub-modules, some embodiments pertain to a system that contains and optimizes over a superset of modules of different properties, chemistries, voltages, operating temperatures, power responses, cycle life, or any other parameter. Modules can be selected from this superset to form the functioning battery in the battery design phase. These embodiments include any type of energy storage module with a unified power output that allows for the incorporation of different capabilities that can be adjusted for optimal performance for forecasted need. It is the combination of detailed control, different capabilities of incorporated energy storage modules, and a forecast built on rich data collection hardware that allows for power system optimization that exceeds the state of art.

The detailed control and forecasting capabilities are incorporated in such a way that this system can reside at the battery management or power system management level, or it can be physically incorporated within the battery itself, allowing for flexibility in design, where this system can be built into the application from the design stage, or can be self-contained such that an existing battery can be replaced with a SRMB than can perform its optimization and management while operating with an existing battery management system.

Additionally, some embodiments generally pertain to a self-regulating modular battery (the "battery" or SRMB). For example, the SRMB may include modules of different chemistries, voltages, power capabilities, or other properties that can be independently regulated and controlled by a battery management system to create a single, unified power output. The modules are able to independently support the load by utilization of independent power output and voltage regulation on each module, that can be controllably directed in their output voltage during discharge (or during charge) of each module such that the power output of the module is precisely controllable by the battery management system but still can contribute power to the common electrical bus forming a unified power output.

The SRMB may include a set of instructions that, when executed by at least one processor, configure the power system to optimize the power drawn from each module using a model of the battery component performance and degradation for each module and module type based on the module condition, including wear, temperature, state of charge, or other state parameters. The performance and degradation model may use a simulation of future power needs based on past usage of this particular battery, or it may leverage past usage examples of other batteries in the desired application, or other battery experience data. A forecasted power demand may be derived from power demands and other parameters, such as time of day, temperature, and state of charge, to name a few. This simulated performance of the SRMB and the forecasted bus power needs are used to calculate an optimized individual and collective power output profile for the battery modules. This can extend power system life, protect capacity and power margin, or other performance parameters.

Figure 6:
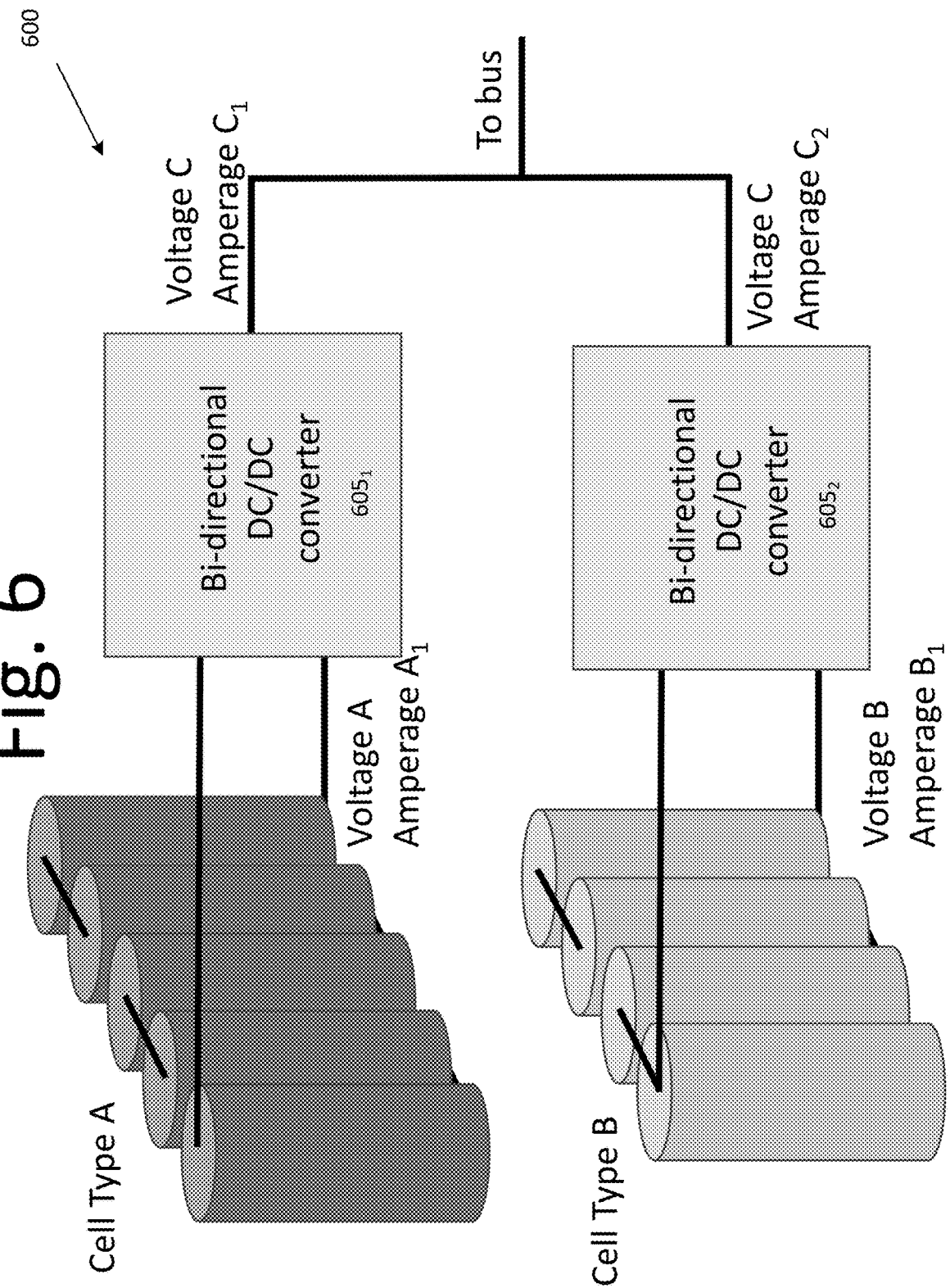
FIG. 6 is a diagram illustrating a battery system having a plurality of modules with bi-directional DC/DC converters, according to an embodiment of the present invention.

In certain embodiments, the SRMB includes a plurality of independent modules of cells or strings of cells (see Cell Type A and Cell Type B) that can be addressed by the SRMB to contribute power to the unified output power bus at a defined current and voltage. The modules are connected to the unified power bus in a parallel configuration such that the output voltage from each module (i.e., Cell Type A and Cell Type B) is inherently equal. As shown in FIG. 6, each module has a bi-directional DC/DC converter $605_1$ and $605_2$, which allows for sourcing and sinking of power to and from the shared power bus. While sinking power, the modules draw current from the shared power bus and adjusts the voltage such that the cell or string of cells in the module are charged to regain stored energy. While sourcing power, the module draws a defined current from its cell or string of cells at any input voltage and outputs the current at the defined output voltage of the shared power bus. The SRMB may define the current at which each module sources or sinks power to and from the bus, thereby allowing for independent power control from each module or submodule. This independent power control is unified into a single output power stream that can support the main application load. For example, module A could support X % of a load, module B could support 100–X %, and module C could support 0% of a load, or any combination of power support fractions. Since the output of each module to the bus is the same voltage, the current outputs can be combined to form a unified output that still leverages the battery modules at different power levels.

In certain embodiments, the SRMB uses machine learning (ML) algorithms or other forecasting techniques to forecast future battery need as an input to the performance and degradation model. ML algorithms that generate battery forecasts can also consider telemetry from the battery regarding the current state of health of each battery module. This forecast is then used to optimize how the battery supports a load to extend life, lower degradation, or retain margin for upcoming power operations. This forecasting can be based on past usage of the battery with respect to location, date, temperature, power sequencing, and other input parameters. It can also be based on planned future usage, the needs of similar systems, or other relevant data to generate a model for future power needs from the battery. Based on past response and future need, the battery supplies current power needs to optimize battery capability for the current cycle and future cycles. This may be accomplished without user input and with no prior knowledge of the application. The ML process for forecasting uses an initial training state, defined in the battery design or initialization, where inputs are weighted to produce a prediction of output variables that match a set of true data, generated from testing, previous usage, or other sources. The ML models can be updated throughout application life by retraining the model periodically on a new set of data on usage and/or performance. The input prediction parameter weights are iteratively adjusted to produce an output that matches the true performance data.

Some examples of improved operation include preparing the battery for stressful usage by preheating, increasing the state of charge in high power modules prior to pulse power, preferentially charging high energy modules for extended baseload operation, redistributing energy between modules based on projected power need, and reserving power or energy based on potential off-nominal (partial failure) bus operation or forecasted future power needs.

FIG. 1 is a diagram 100 illustrating a self-regulating battery 100, according to an embodiment of the present invention. It should be appreciated that depending on the embodiment, the terms model and module may be used interchangeably. In some embodiments, self-regulating battery 100 collects internal parameters and external parameters, and stores the parameters into parameter history. Internal parameters may include battery and module current (I) and voltage (V) response, battery heat generation, and battery impedance. External parameters may include outside temperature, date and calendar, and location and destination. All of these data parameters define the battery usage history and current status. This definition of battery module usage and status creates a parameter history state to inform the forecast module 105 to generate projections of how the battery will be used in the future.

ML module 105 may receive, from the parameter history state, information on the current status of the battery, including battery telemetry, and the current status of the external application, including telemetry of the vehicle, payload, or device. ML module 105 also takes as an input the intended future state when possible to generate a family of expected future battery power demand, weighted by the probability of occurrence. This demand forecast is in the form of power, time plots.

ML module 105 may also receive the initial training state, which may be saved in a separate database outside of battery 100. The initial training state may include global usage pattern(s) and power system degradation test(s). The training state for the ML module is based on anticipated battery usage pattern at the inception of the ML Module. This training state is then updated over battery life with changes to anticipated usage patterns. The ML Module then updates its training state from both internal information on experienced usage as well as external inputs to planned changes to battery utilization.

Battery SoH module 115 takes an initial characterization of the battery module conditions based on the battery performance parameters including capacity, impedance, heat generation, and current-voltage (I,V) response. This initial battery SoH is updated over battery life with information recorded from the battery performance and self-diagnostics.

The demand forecasts are sent to power system module 110. In addition to receiving demand forecasts, power system module 110 receives the battery SoH from SoH module 115. Power system module 110 is based on an initial battery characterization for how the battery and its components respond to loads and temperatures. This initial characterization-based state is updated with the SoH of the battery, to change the battery response based on changes included in the SoH, such as battery impedance, heat generation, and measured I,V performance. This forms the Current Battery Characterization (CBC).

Using the demand forecasts and CBC, power system module 110 generates Module Support Plans (MSPs) to support the forecasted demand from the hardware of battery 100. The battery modules may be directed to support the requested power load independently of each other. The MSPs are scored based on efficiency of power extraction from the battery. The efficiency of instantaneous usage for each module is calculated using the power efficiency $V_i/V_o$, where $V_i$ is the instantaneous voltage of a module in response to a load and $V_o$ is the open circuit voltage of that module at its current state of charge. The plan efficiency score is calculated by multiplying the power efficiency at each time unit by the charge passed Q. The most efficient of the MSPs are sent for usage scoring. This is combined with an updated SoH value based on an induced degradation from the usage plan. The induced degradation is defined in the initial battery characterization. The battery capacity and impedance are reduced through usage as determined in the battery design. The scored plans are passed on to generate a usage score.

In the usage score, the MSPs are evaluated against battery requirements, including battery capacity margin and temperature limits. Plans in violation of input limits are rejected, and the remaining plans are compared by their usage score and their capacity degradation, as forecast by the power system module 110. The selection of the highest scoring plan among those scored by usage score and capacity degradation is determined using relative user input weights for battery efficiency, battery life, capacity retention, or other user-desired parameters.

Figure 2:
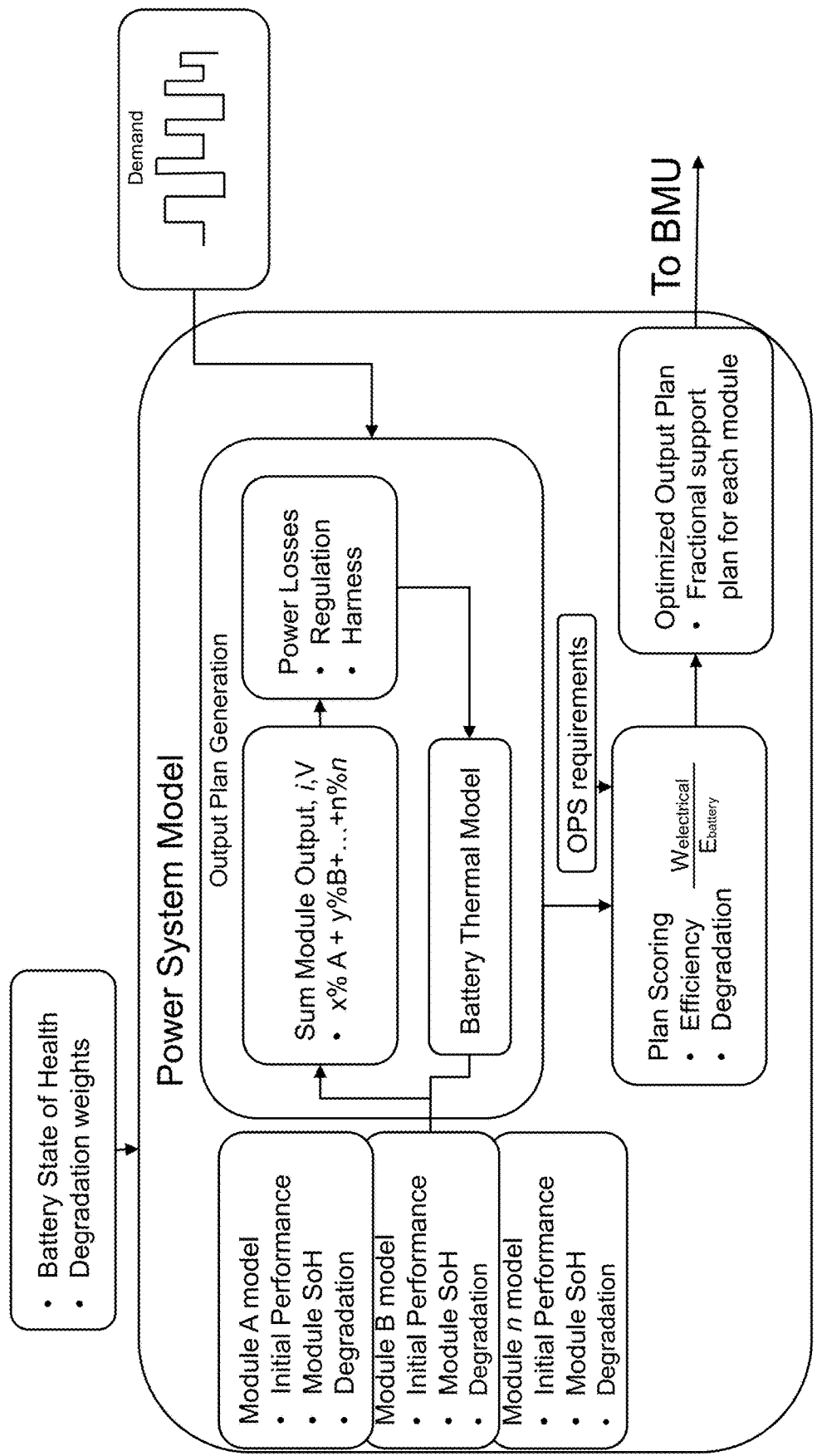
FIG. 2 is a diagram illustrating a power system model, according to an embodiment of the present invention.

FIG. 2 is a diagram illustrating power system model 110, according to an embodiment of the present invention. In some embodiments, power system model 110 uses a plurality of models (e.g., module A model, module B model, . . . module n model), one for each independent module in the battery. Each of these models is updated by the battery SoH and the degradation weights produced by the ML module, and also by the power system thermal model. Using this information, battery operation plans are generated for a given future demand. This demand in some embodiments is generated from the ML demand forecast model.

Each battery operation plan may be scored by how efficiently the total energy of the battery is used as noted above. These plans are further evaluated for other goals such as capacity or power margin, capacity degradation, and uncertainty in demand forecast. The user or designer of the system may input a scoring mechanism to optimize their preferred criteria. The optimal plan may then be passed to the battery management unit (BMU) for implementation.

Figure 3:
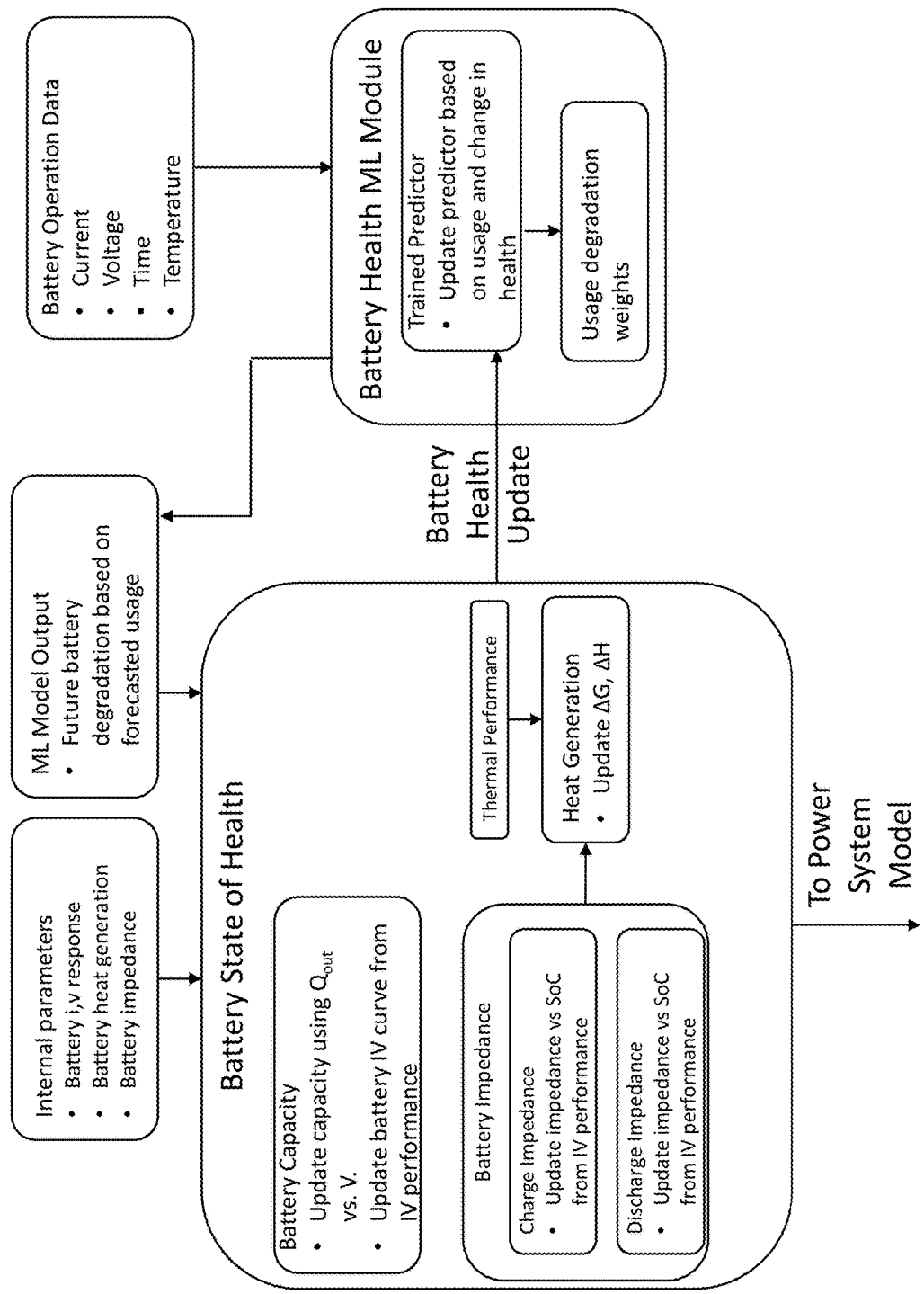
FIG. 3 is a flow diagram illustrating a battery SoH module, according to an embodiment of the present invention.

FIG. 3 is a flow diagram illustrating a battery SoH module 115, according to an embodiment of the present invention. In some embodiments, battery SoH module 115 receives internal parameters, such as battery current (I) and voltage (V) responses, battery heat generation and battery impedance, and the ML model output. The ML model output includes future battery degradation based on forecasted usage. The battery SoH is then generated as a set of parameter weights that allows for characterization of the battery across a set of performance parameters, including capacity, power capability, impedance, capacitance, voltage response time, and power efficiency. Consider a simple case of a 2 module battery. In one example, let us assume that Module A is at 50% remaining life and Module B is at 75% remaining life. In this example, the discharge balance could initially be Module A 33% support and Module B 67% support to try and equalize the remaining life. However, if Module B degrades rapidly (degradation weight 2X/Ah, compared to A at 1.0X/Ah) when supplying very high pulse power, and when a forecast has assigned a probability (weight) of a high pulse power output during the next discharge period of 80%, then prior to the probable high current pulse, the discharge balance could be adjusted to Module A 20%, Module B 80%. In some embodiments, the discharge balance could be adjusted again for the probable high pulse portion, with Module A at 90% and Module B at 10% to reduce the total battery degradation.

In an embodiment, battery SoH module 115 determines the SoH from the baseline degradation outputted by the baseline degradation model for the battery, and updates the battery SoH using the battery's use history and the ML forecast for degradation. In some further embodiments, the future SoH can be calculated from projected future usage. This allows for scoring power usage plans on potential battery degradation.

Battery SoH module 115 sends a Battery Health Update to the ML Module, which may generate a set of degradation weights for different charge and discharge operations, temperature, and time. These weights are continually updating the initial state the ML Module has from inception. These weights can be factors including change in capacity per electrical throughput ($\Delta Q/Ah$) or temperature duration ($\Delta Q/(° C.*s)$), change in change and discharge impedance per electrical throughput ($\Delta R/Ah$) or temperature duration ($\Delta R/(° C.*s)$). This data may then be used in power system model 110 to score usage plans based on degradation for future use. These weights are inputs sent to the power system model and the usage score modules that allow for forecasting of the battery response to usage, both in terms of the battery's response to an electric load, and also the forecasted battery degradation for proposed future battery utilization.

The battery capacity model weights in Battery SoH module 115 are based on the throughput of the battery and the predicted or measured effect of decreasing the available capacity of the battery. The battery capacity model weights may also be based on any other modeling approach that evaluates the loss of capacity of the battery from usage, temperature, or calendar effects on the battery or individual battery modules or cells. In a similar fashion, the battery impedance weights are the calculated or measured effects of changes in the battery, module, or cell impedance from usage, temperature, or time effects. The battery heat generation module uses the battery impedance weights and the current flowing through the battery to make a calculation of how much heat is generated from usage of the battery. This information is then used as an input to the battery SoH module.

Figure 4:
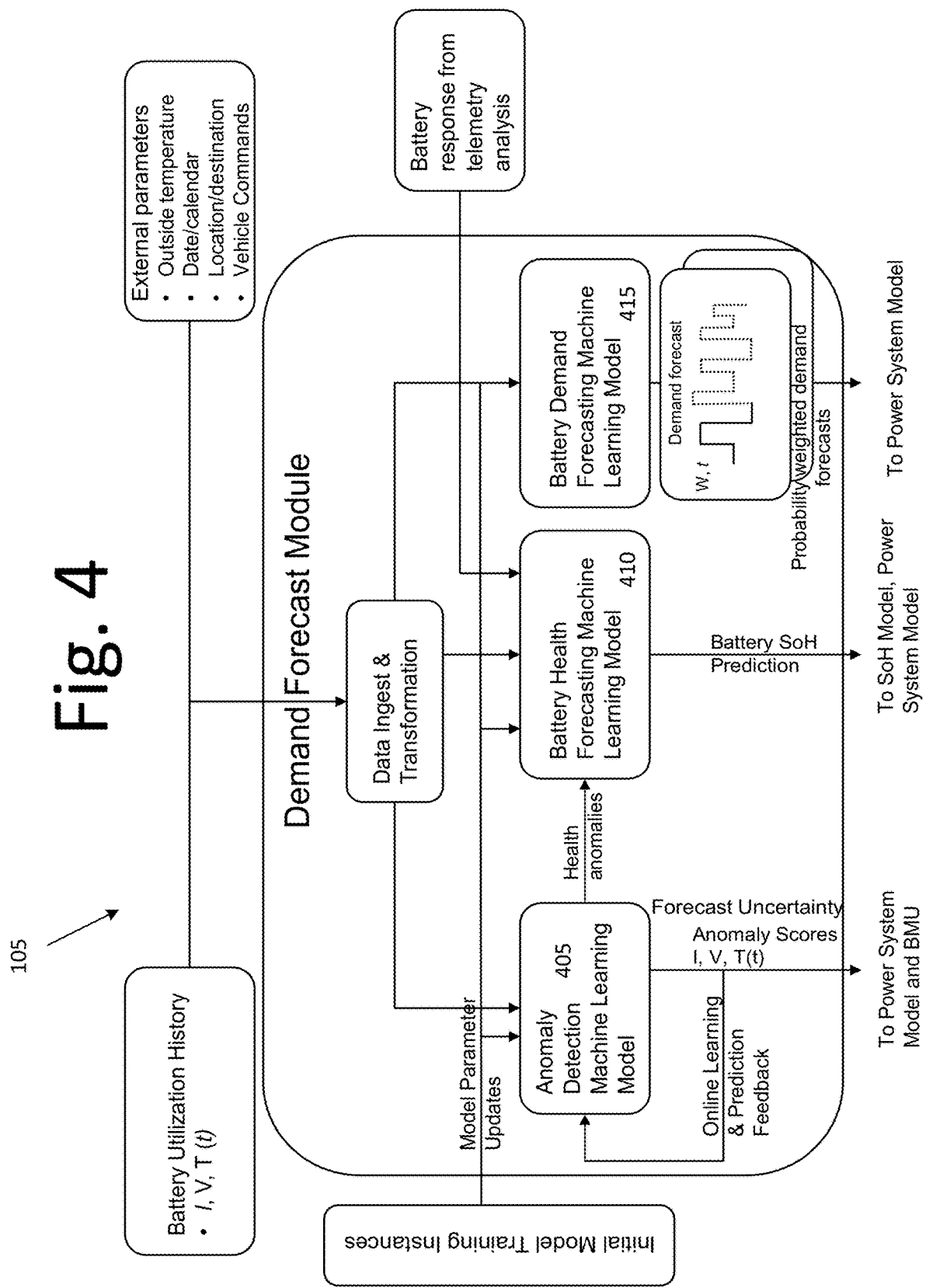
FIG. 4 is a flow diagram illustrating a ML module, according to an embodiment of the present invention.

FIG. 4 is a flow diagram illustrating a Demand Forecast (or ML) Module 105, according to an embodiment of the present invention. In some embodiments, ML module 105 uses a basis training instance for the power system, and then updates that model using the system telemetry and battery SoH to generate a forecast for the battery response to usage. The demand is forecasted separately using the past usage history as separate demand forecasts, which are fed to power system model 110.

Information on the battery utilization (past load demand from bus), as well as battery response to demand (battery IV response) and battery SoH, are added to the external data to update the training set. ML module 105 can then be retrained based on the new data on the battery performance and conditions to maintain accuracy of ML module 105.

Anomaly detection ML model 405 compares the forecast of battery performance to power system telemetry, and compares detected anomalies to deviations within the basis training set. Detected anomalies trigger a shift in weights from the battery baseline forecast to the performance-based forecast. Battery health performance is then updated and sent to the SoH module. A set of probability-weighted battery demands is also generated from past usage and current conditions. These forecasts are sent to the power system module to generate support plans for scoring.

The battery health forecasting ML model 410 is initially based on the characterization of the battery from design. It has weights based on test data that show how the battery SoH changes with utilization. These weights are updated with the output of the battery SoH module and the battery utilization history by testing the prediction of battery health forecasting ML model 410 on the utilization history, and updating the forecasting weights for the Battery SoH Module outputs.

Battery demand forecasting ML model 415 is based on the initial model of utilization, which is based on the power system design or other baseline predictions of battery usage. This model predicts the power need versus time, and the initial prediction is based on the forecasted external parameters including external temperature, date, location, and application specific measurements, settings, or conditions. These conditions determine the power demand forecast, which is output to the power system model to determine how the battery would meet this demand. Battery demand forecasting ML model 415 is then updated by training it based on the ongoing usage of the battery in the application. Usage of the battery may generate data on the external parameters based on when and how the battery is being used. Battery demand forecasting ML model 415 can be retrained by updating the input weights in the model 415 to keep the model 415 updated.

Returning to anomaly detection ML model 405, this model takes both battery performance and SoH measured data from the battery and compares the real data against the forecasted data from the battery health model predictions. Anomaly detection ML model 405 then flags significant deviations between prediction and performance. In the case of sufficiently large deviations, a new retraining of battery health forecasting ML model 410 can be triggered to ensure that the model responds quickly to changes in the battery conditions.

Figure 5:
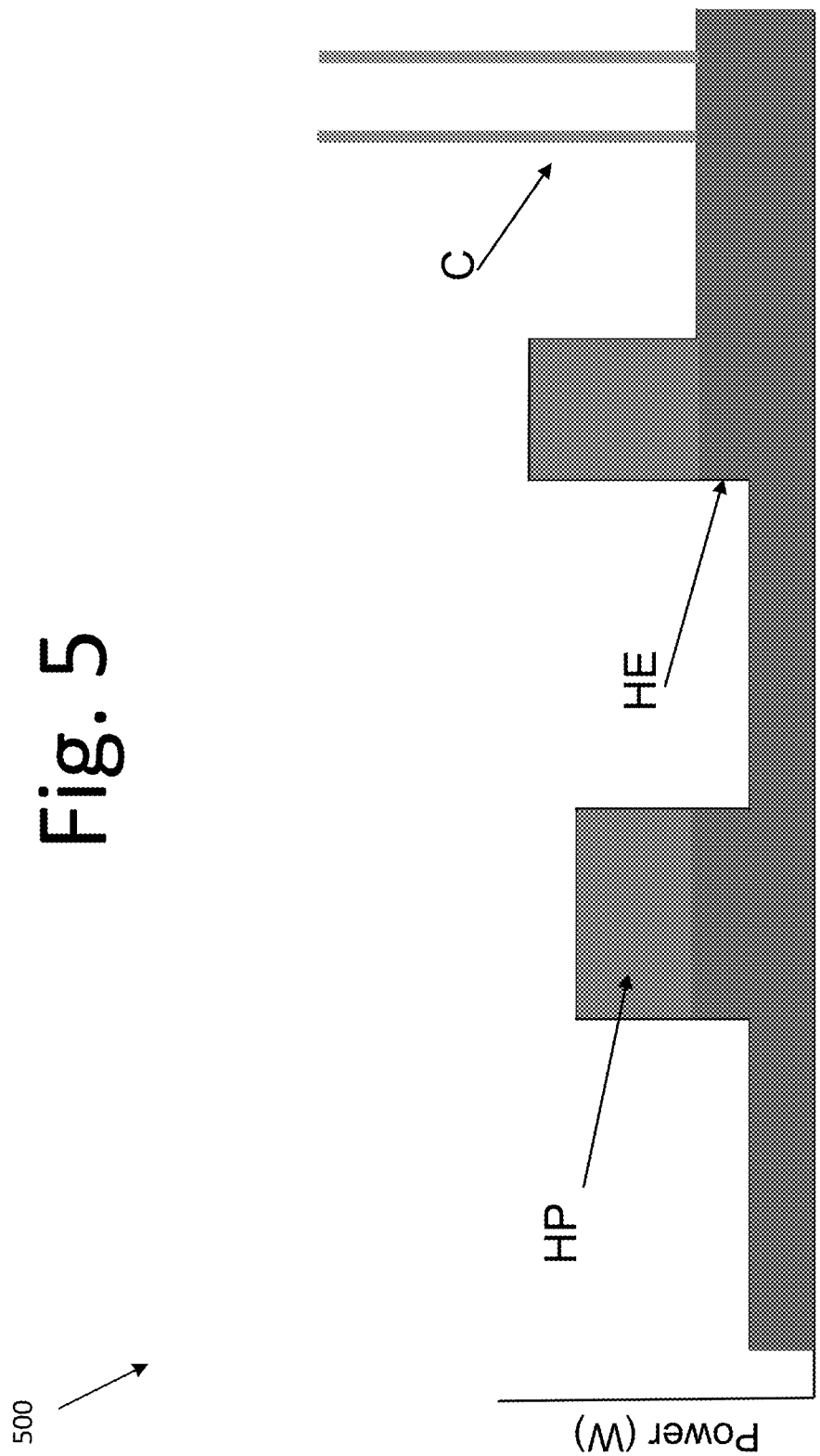
FIG. 5 is a chart illustrating how the battery output can be regulated to optimize the performance of individual battery subcomponents, according to an embodiment of the present invention.

FIG. 5 is a chart 500 illustrating how the battery output can be regulated to optimize the performance of individual battery subcomponents, according to an embodiment of the present invention. In chart 500, an example of a battery where higher power discharges are supported by (in this example of SRMB module design) dedicated high power (HP) cells, with baseload power from high energy (HE) cells, and power spikes from capacitors (C). Supporting different parts of the power requirements from the appropriate module types reduces wear, improves response time, and reduces system mass. This illustration demonstrates how the management of the modular hardware optimizes the performance of the battery. By saving the high power (HP) modules of the battery for surges in power demand, or by saving the capacitor (C) for significant pulses in power demand, individual modules can be reserved for application where these modules perform optimally. Misapplication of battery modules to support power requirements may result in accelerated battery degradation.

One or more embodiments pertain to an adaptive forecast of demand on the SOH of the battery. Generation of the forecast may allow for scoring of battery usage plans based on a weighted probability of demand. This forecasting of demand allows for changing battery performance in advance of need, allowing the reservation of battery capacity to meet future needs.

Taking a look at the current state of the art, battery management systems typically rely on sequestering a portion of the battery capability from normal usage. This shows up as margin in spacecraft or lockout capacity in EVs.

Embodiments of the present invention, however, allow the battery to operate more efficiently than conventional batteries. For example, let's consider regenerative braking in electric vehicles (EVs), where high charging currents from braking are limited when battery temperature is low. In this example, when the battery temperature is low, regenerative braking is limited or is turned off. However, the braking demand from a morning commute is easily predictable. The SRMB in some embodiments forecasts this high rate charging need and respond by preheating certain modules in the battery, allowing full capture of regeneration power. In another embodiment, the SRMB, prior to braking, extracts power from only one battery module, lowering its state of charge, allowing for more self-heating and capacity for accepting full regenerative charge.

In yet another embodiment, a module with a higher rate charging capability is selected within the SRMB to be the recipient of the regenerative charging energy. Each of these examples is made possible by the forecast of a future need (regenerative charging current). However, these can only be optimally responded to with the use of detailed control of individual modules that have varying capabilities, different voltages and state of charge, and charging rates, and that still are able to discharge afterwards. Conventional designs would not be able to (a) respond due to the slowness of heating the entire battery, (b) empty a single module to take advantage of higher charge rates for low state of charge modules, or (c) function with modules of differing chemistries or voltages in both charging and discharging.

The battery may also be more resilient to partial failures. For example, with ML detection of battery performance anomalies, battery degradation is managed by reducing demand on failing battery modules, preserving capability for emergencies. In addition, loss of battery capability from failure of a module can not only be predicted, but can be mitigated by altering the outputs of other modules to respond with additional power. This mitigation is achieved by having all other modules respond equally, and with the ability to offload this power need to the modules with the best SoH, or best chemistry capability to respond with the minimum amount of forecasted wear.

Figure 7:
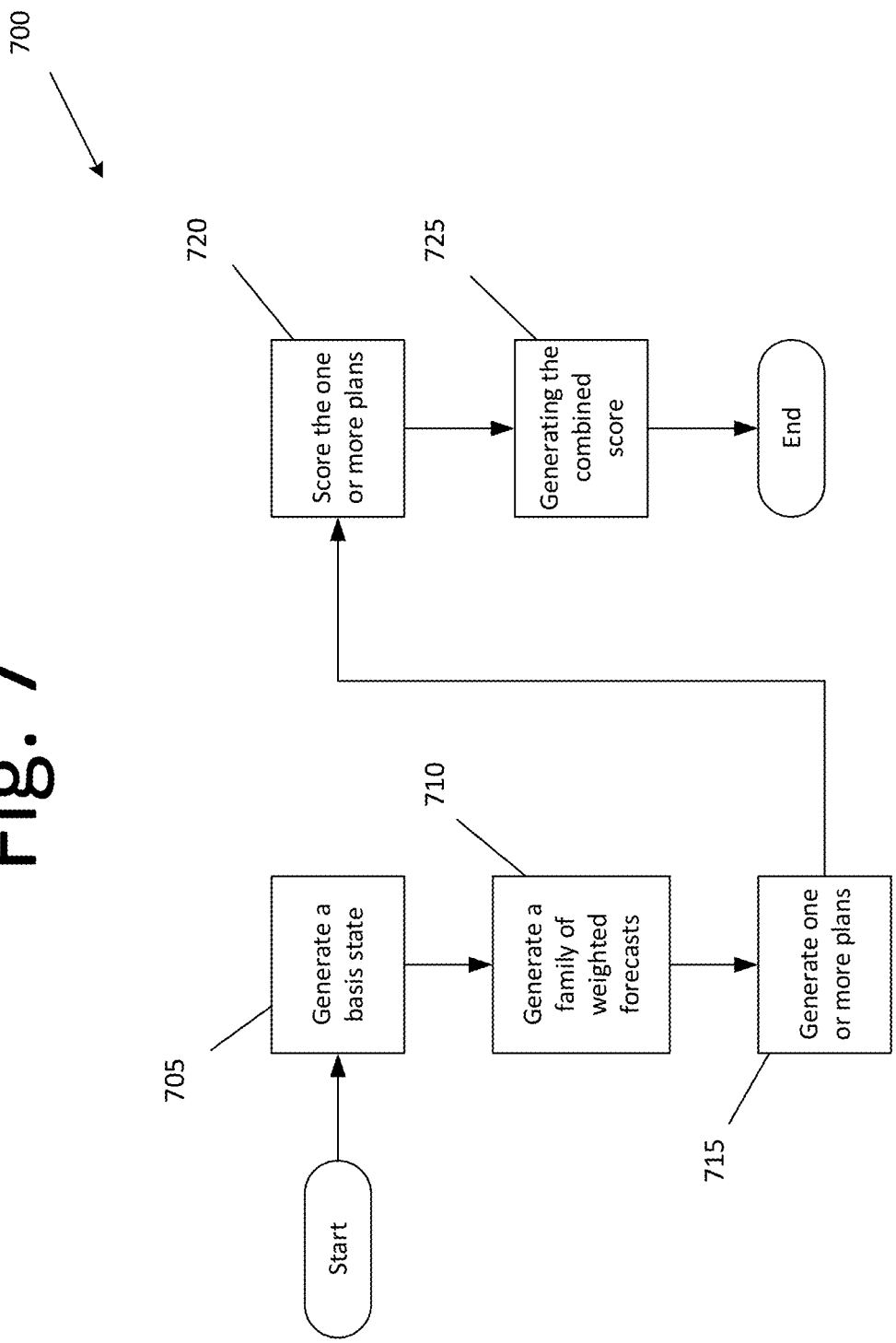
FIG. 7 is a flow diagram illustrating a method for self-regulating a battery, according to an embodiment of the present invention.

FIG. 7 is a flow diagram illustrating a method 700 for self-regulating a battery, according to an embodiment of the present invention. The method includes generating at 705 a basis state for one or more modules using one or more system inputs. The system inputs comprise current, voltage, and battery degradation. At 710, the method includes generating a family of weighted forecasts for future bus demands using usage and performance based weights, and at 715, the method includes generating one or more plans to support demand from the battery using the weighted forecasts. The method at 720 includes scoring the one or more plans based on efficiency of power extraction from the battery, and combining the scored one or more plans with an updated SoH value based on induced degradation from a usage plan. The method at 725 includes generating the combined scored for each of the one or more plans, and transmitting one of the combined scored to the battery management unit for execution.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but does not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A system for self-regulating a battery, comprising: a machine learning module receiving battery parameter history and generating a battery degradation forecast and one or more probability weighted demand forecasts; a battery state of health (SoH) module computing an updated battery model using one or more internal battery parameters and the battery degradation forecast; a power system module generating, from the updated battery model, one or more module support plans where one of the one or more module support plans is used as a power out plan for a battery management unit, wherein the one or more module support plans are evaluated against one or more battery requirements to generate a usage score to be assigned to each of the one or more module support plans.

2. The system of claim 1, wherein the machine learning module comprises a demand forecast module generating the battery degradation forecast, a battery SoH prediction, and the probability weighted demand forecasts.

3. The system of claim 2, wherein the demand forecast module comprises
an anomaly detection machine learning model comparing a forecast of battery performance to power system telemetry, and comparing detected anomalies to deviations within a basis training set, wherein
the detected anomalies trigger a shift in weights from a battery baseline forecast to a performance-based forecast.

4. The system of claim 2, wherein the demand forecast module comprises
a battery health forecasting machine learning model generating one or more weights for the battery SOH using battery response from telemetry analysis, battery utilization history, external parameters, initial model training instances, and health anomalies.

5. The system of claim 2, wherein the demand forecast module comprises
a battery demand forecasting machine learning model generating the one or more probability weighted demand forecasts using battery response from telemetry analysis, battery utilization history, external parameters, and initial model training instances.

6. The system of claim 1, wherein the power system module generating a plurality of battery operation plans for a given future demand from a plurality of models, one for each independent module in the battery.

7. The system of claim 6, wherein the power system module generating a plan score to be assigned to each of the plurality of battery operation plans.

8. The system of claim 7, wherein the power system module generates an optimized output plan based on an analysis of the plan score assigned to each of the plurality of battery operation plans.

9. The system of claim 1, wherein the battery SoH module receives the one or more internal battery parameters, battery heat generation and battery impedance, and a machine learning model output to generate a battery SoH, wherein
the machine learning model output comprises a future battery degradation based on a forecasted usage.

10. The system of claim 9, wherein the battery SoH module determines the battery SoH from a baseline degradation outputted by a baseline degradation model for the battery, and updates the battery SoH using a use history of the battery and a machine learning forecast for degradation.

11. The system of claim 10, wherein the battery SoH module generates a set of degradation weights for different charge and discharge operations, temperature, and time, wherein
the set of degradation weights are used in the power system module to score one or more usage plans based on degradation for future use.

12. A system for self-regulating a battery, comprising: a machine learning module receiving battery parameter history and generating a battery degradation forecast and one or more probability weighted demand forecasts, wherein the machine learning module comprises a demand forecast module generating the battery degradation forecast, a battery SoH prediction, and the one or more probability weighted demand forecasts; a battery state of health (SoH) module computing an updated battery model using one or more internal battery parameters and the battery degradation forecast; a power system module generating, from the updated battery model, one or more module support plans where one of the one or more module support plans is used as a power out plan for a battery management unit, wherein the one or more module support plans are evaluated against one or more battery requirements to generate a usage score to be assigned to each of the one or more module support plans.

13. The system of claim 12, wherein the demand forecast module comprises
an anomaly detection machine learning model comparing a forecast of a battery performance to power system telemetry, and comparing detected anomalies to deviations within a basis training set, wherein
the detected anomalies trigger a shift in weights from a battery baseline forecast to a performance-based forecast.

14. The system of claim 12, wherein the demand forecast module comprises
a battery health forecasting machine learning model generating one or more weights for the battery SOH using battery response from telemetry analysis, battery utilization history, external parameters, initial model training instances, and health anomalies.

15. The system of claim 12, wherein the demand forecast module comprises
a battery demand forecasting machine learning model generating the one or more probability weighted demand forecasts using battery response from telemetry analysis, battery utilization history, external parameters, and initial model training instances.

16. The system of claim 12, wherein the power system module generating a plurality of battery operation plans for a given future demand from a plurality of models, one for each independent module in the battery.

17. The system of claim 16, wherein the power system module generating a plan score to be assigned to each of the plurality of battery operation plans.

18. The system of claim 17, wherein the power system module generates an optimized output plan based on an analysis of the plan score assigned to each of the plurality of battery operation plans.

19. The system of claim 12, wherein the battery SoH module receives the one or more internal battery parameters, battery heat generation and battery impedance, and a machine learning model output to generate a battery SoH, wherein
the machine learning model output comprises a future battery degradation based on a forecasted usage.

20. The system of claim 19, wherein the battery SoH module determines the battery SoH from a baseline degradation outputted by a baseline degradation model for the battery, and updates the battery SoH using a use history of the battery and a machine learning forecast for degradation.

21. The system of claim 20, wherein the battery SoH module generates a set of degradation weights for different charge and discharge operations, temperature, and time, wherein
the set of degradation weights are used in the power system module to score one or more usage plans based on degradation for future use.

* * * * *